United States Patent [19]
Karino

[11] Patent Number: 5,508,967
[45] Date of Patent: Apr. 16, 1996

[54] LINE MEMORY

[75] Inventor: Shingo Karino, Osaka, Japan

[73] Assignee: Matsushita Electric Industrial Co., Ltd., Osaka, Japan

[21] Appl. No.: 286,453

[22] Filed: Aug. 5, 1994

[30] Foreign Application Priority Data

Aug. 9, 1993 [JP] Japan ................... 5-197066

[51] Int. Cl.$^6$ ..................... G11C 7/00
[52] U.S. Cl. .................. 365/219; 365/220; 365/221
[58] Field of Search ..................... 365/219, 220, 365/221, 230.05; 327/415, 407, 403

[56] References Cited

U.S. PATENT DOCUMENTS

| | | | |
|---|---|---|---|
| 4,288,864 | 9/1981 | Harroun et al. | 365/219 |
| 4,775,990 | 10/1988 | Kamuro et al. | 365/219 X |
| 4,945,518 | 7/1990 | Muramatsu et al. | 365/219 X |

FOREIGN PATENT DOCUMENTS

| | | | |
|---|---|---|---|
| 0008373 | 1/1987 | Japan | 365/219 |
| 4-172688 | 6/1992 | Japan . | |

*Primary Examiner*—David C. Nelms
*Assistant Examiner*—Son Dinh
*Attorney, Agent, or Firm*—Willian Brinks Hofer Gilson & Lione

[57] ABSTRACT

A serial/parallel converter has a function of forwarding data of remainder bits of p in number (e.g., 3) less than the serial/parallel number, which are positioned at the end of serial data, from the head from latches to p parallel output terminals via selectors. Accordingly, parallel data in which the data of remainder bit number are arranged correctly can be serially developed even though a simple delay amount is an arbitrary bit width. Thus, contemplated is a line memory of simple delay type which can set the simple delay amount to an arbitrary bit width, while performing serial/parallel conversion.

11 Claims, 12 Drawing Sheets

LINE MEMORY

BACKGROUND OF THE INVENTION

This invention relates to a line memory of simple delay type which stores serial data, converting them into parallel data.

In these days, requirement for high-density integrated circuit using a semiconductor has been increased. As elements of large-sized integrated circuit for a specific purpose, ROM, RAM and the like which are conventionally provided outside are built in one integrated circuit, in addition to AND element and OR element, the integration of which almost reaches to a physical limit. The semiconductor integrated circuit in which such high-density functions are built in one part becomes necessary in various fields of article, such as portable compact devices.

There is a line memory as an example of function device, such as ROH, RAM, which are provided outside. The line memory is a device having an advanced function for a device dealing with data having periodicity, such as image information. While the line memory enhances the integration of elements by bearing a data holding function to the RAM, much time is required for memory access, thus the RAM bars high-speed operation. External serial data are converted into parallel data by using the internal device, such as a shift register to thus enable the high-speed operation apparently.

There are three types of line memories according to the function: (1) simple delay type, (2) START type and (3) write/read clock type. In the simple delay type, data are written in synchronization with a clock after a reset signal is initially input, then the data are read out after a given delay time.

In the conventional simple delay method, only serial data whose number is equal to the serial/parallel number (=number of serial data to be converted into parallel data, i.e., the number of data composing one parallel data) are converted into parallel data to thus access the parallel data to a memory. Thereafter, the parallel data are converted into serial data. The memory access of the parallel data is an operation of writing one parallel data into one array of memory, and the access is repeated times of number of arrays in the memory array. Accordingly, the delay amount in the simple delay method is the serial/parallel number×the array number of memory array.

However, in the line memory of above mentioned simple delay type, as for data having an arbitrary bit width that fraction bits remains when the bit width is divided by the serial/parallel number, the remainder bits are not positioned at a head of one parallel data when the remainder bits are output from the serial/parallel converter though the remainder bits are parallel-converted by a shift register or the like, because the parallel operation is performed in the line memory. Therefore, the delay amount in the simple delay method is restricted to the serial/parallel number×the array number of memory array, with a result that the line memory of simple delay type is applicable only to data of bit width which agrees the restriction. In consequence, the use of line memory of simple delay type is so restricted.

Recently, a case is desired that, when an image is formed by indicating data written in the line memory onto a display of a Braun tube, almost part of the Braun tube continues to display a previous image and remaining small part displays new image different from the previous image. However, since the parallel operation is performed in the line memory, there is a restriction that control to data is performed per one parallel operation. Therefore, the conventional line memory is hard to perform the control that is capable of writing of only arbitrary data.

SUMMARY OF THE INVENTION

The object of the present invention is to provide a line memory of simple delay type with no restriction of delay amount that the serial/parallel number×the array number of the memory array, while performing parallel operation therein. Thereby, data having an arbitrary bit width can be stored in the line memory of simple delay type and the line memory of simple delay type can be applicable for various purposes.

Another object of the present invention is to provide a line memory which can perform write-enable-control to an arbitrary data, while performing parallel operation.

To attain the above objects, a line memory of simple delay type of the present invention parallel-converts, by using a shift register, data of remainder bits of less than serial/parallel number out of data with an arbitrary bit width, and the remainder bits are fetched from a head of serial/parallel converter.

In the present invention, while inputting serial data regardless of whether they are to be written, write enable signals which allow writing are input in synchronization with the input of serial data. According to the write enable signals, the writing of the input serial data into a memory array is optionally controlled.

In detail, a line memory in the present invention comprises: a serial/parallel converter for converting serial input data into parallel data; a memory array for storing the parallel data output from said serial/parallel converter; a parallel/serial converter for converting the parallel data read out from said memory array into serial output data; a word control circuit for operating an address of said memory array; a system control circuit for controlling said serial/parallel converter said parallel/serial converter and said word control circuit, wherein said serial/parallel converter comprises one external serial input terminal, and parallel output terminals of N in number (N is an arbitrary natural number), said serial/parallel converter is composed of memory elements of N in number and selection elements of L in number (L is a natural number smaller than N) each of which has a first input terminal and a second input terminal, said first memory element is connected at the input side thereof to said external serial input terminal, said second to N-th memory elements are respectively connected at the input sides thereof to the output sides of said first to (N−1)-th memory elements, said first input terminals of said L selection elements are respectively connected to the output sides of said first to L-th memory elements, said second input terminals of said L selection elements are respectively connected to the output sides of said (N-L+1)-th to N-th memory elements, said first to (N-L)-th memory elements are respectively connected at the output sides thereof to said first to (N-L)-th parallel output terminals, and said (N-L+1)-th to N-th selection elements are respectively connected at the output sides thereof to said (N-L+1)-th to N-th parallel output terminals.

Another line memory in the present invention comprises: a serial/parallel converter for converting serial input data into parallel data; a memory array for storing the parallel data output from said serial/parallel converter; a parallel/serial converter for converting the parallel data read out from said memory array into serial output data; a word control circuit for operating an address of said memory array; and a system control circuit for controlling said serial/parallel converter, said parallel/serial converter and said word control circuit, wherein said serial/parallel converter has functions of receiving serial data and serial data write enable signals respectively corresponding to data composing the serial data, and of outputting, as parallel data, only data that to which the corresponding serial data write enable signal allow writing out of the serial data. Further, said serial/parallel converter is composed of first memory elements of N in number, second memory elements of N in number, third memory elements of N in number, fourth memory elements of N in number, AND elements of N in number, cutoff elements of N in number, where N is an arbitrary natural number, said first first memory element out of said first memory elements is connected at the input side thereof to said external serial input terminal, said second to N-th first memory elements are respectively connected at the input sides thereof to the output sides of said first to (N-I)th first memory elements, said N second memory elements are respectively connected at the input sides thereof to the output sides of said N first memory elements, said first third memory element out of said third memory elements receives at the input side thereof serial data write enable signals, said second to N-th third memory elements are respectively connected at the input sides thereof to the output sides of said first to (N−1)-th third memory elements, said N fourth memory elements are respectively connected at the input sides thereof to the output sides of said N third memory elements, said N AND elements are respectively connected at respective one input sides thereof to the output sides of said N fourth memory elements and respectively receive at respective other input sides thereof parallel data write enable signals, said N AND elements are respectively connected at the output sides thereof to control lines of said N cutoff elements, said N cutoff elements are respectively connected at the input sides thereof to the output sides of said N second memory elements, and said N cutoff elements are respectively connected at the output sides thereof to said first to N-th bit lines of said memory array.

According to the above constructions, in the line memory of simple delay type in the present invention, after the data with arbitrary width are serial/parallel converted, as well as in the conventional one by the N memory elements in the serial/parallel converter per the serial/parallel number, the data with arbitrary bit width are output as one parallel data (serial/parallel number=N) from the N parallel output terminals to the memory array so that the data are stored in one array of the memory array. This operation is repeated.

The data of remainder bit number (p) which are positioned at the end are serial/parallel converted by the p memory elements from the end, are forwarded, starting from the head, to p parallel output terminals by the selection element, are output from the p parallel output terminals to the memory array, then stored in one array of the memory array from the head to p-th bit. Wherein, one parallel data including data of the remainder bit number includes other data which are to be stored in the memory array. Such the other data involve no problem when they are read out from the memory array.

In the line memory of the present invention, the serial input data are parallelly developed and the memory access is performed at every one parallel data. However, after the serial data write enable signal is once fetched in the internal register, only a data corresponding to the write enable signal out of the parallel data is write-enable-controlled at memory access. Thus, the line memory can perform the write-enable-control to an arbitrary data, while performing the parallel operation.

BRIEF DESCRIPTION OF THE ACCOMPANYING DRAWINGS

DETAILED DESCRIPTION OF THE INVENTION

Preferred embodiments of the present invention are described below, with reference to the accompanying drawings.

Figure 1:
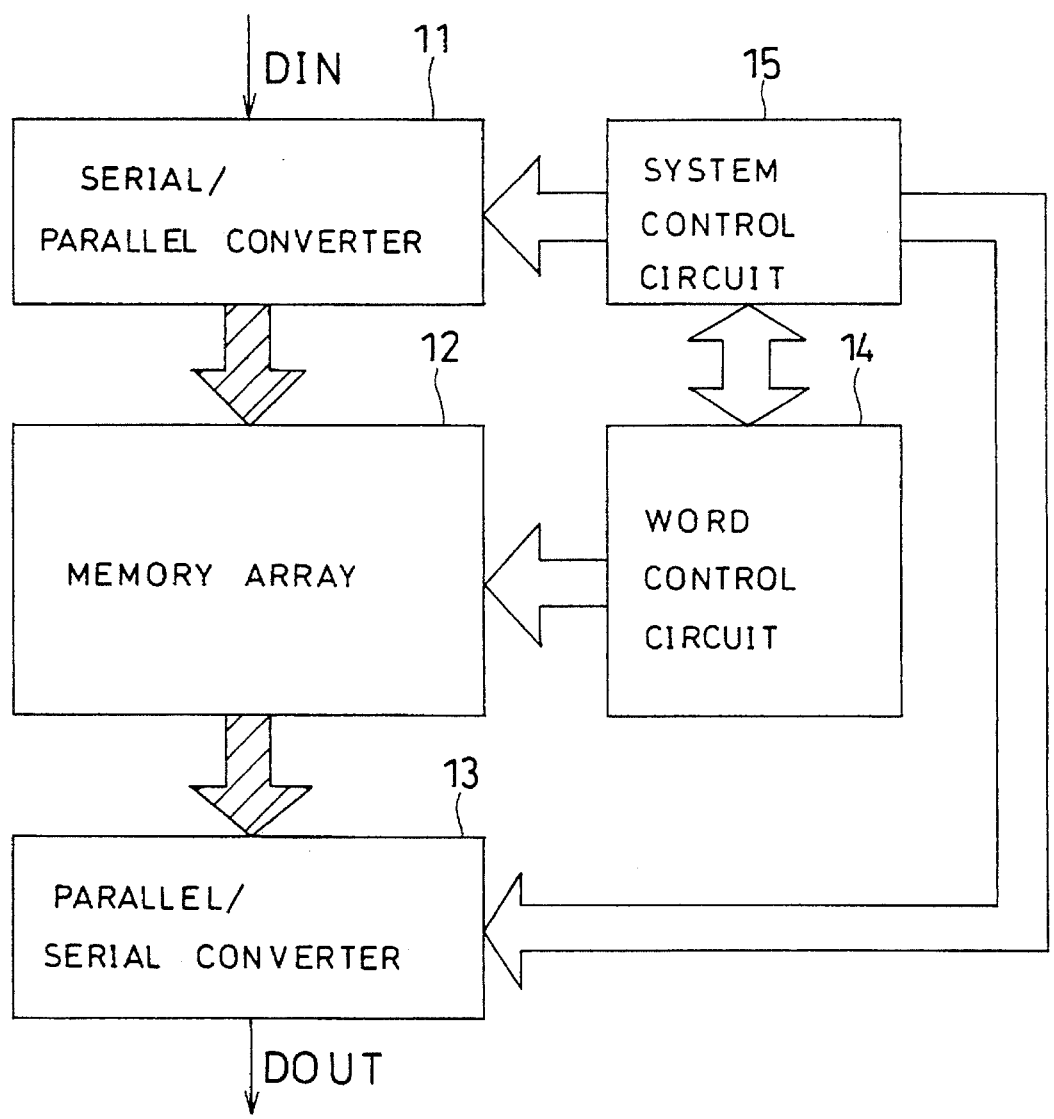
FIG. 1 is a block diagram showing a whole construction of a line memory according to an embodiment of the present invention.

FIG. 1 is a block diagram of a line memory of simple delay type according to this embodiment of the present invention. In this embodiment, a case where a data having an arbitrary bit width B are dealt with is discussed, wherein B=N.(M−1)+L (B= arbitrary bit width, N=serial/parallel number, (M−1)=number of arrays in memory array, and L=bit number of remainder).

In FIG. 1, reference numeral 11 denotes a serial/parallel converter for converting serial input data into parallel data. 12 denotes a memory array for storing the parallel data. 13 denotes a parallel/serial converter for converting the parallel data read out from the memory array 12 into serial data. 14 denotes a word control circuit for controlling an address pointer of the memory array 12. 15 denotes a system control circuit for controlling the serial/parallel converter 11, the parallel/serial converter 13 and the word control circuit 14.

Figure 2:
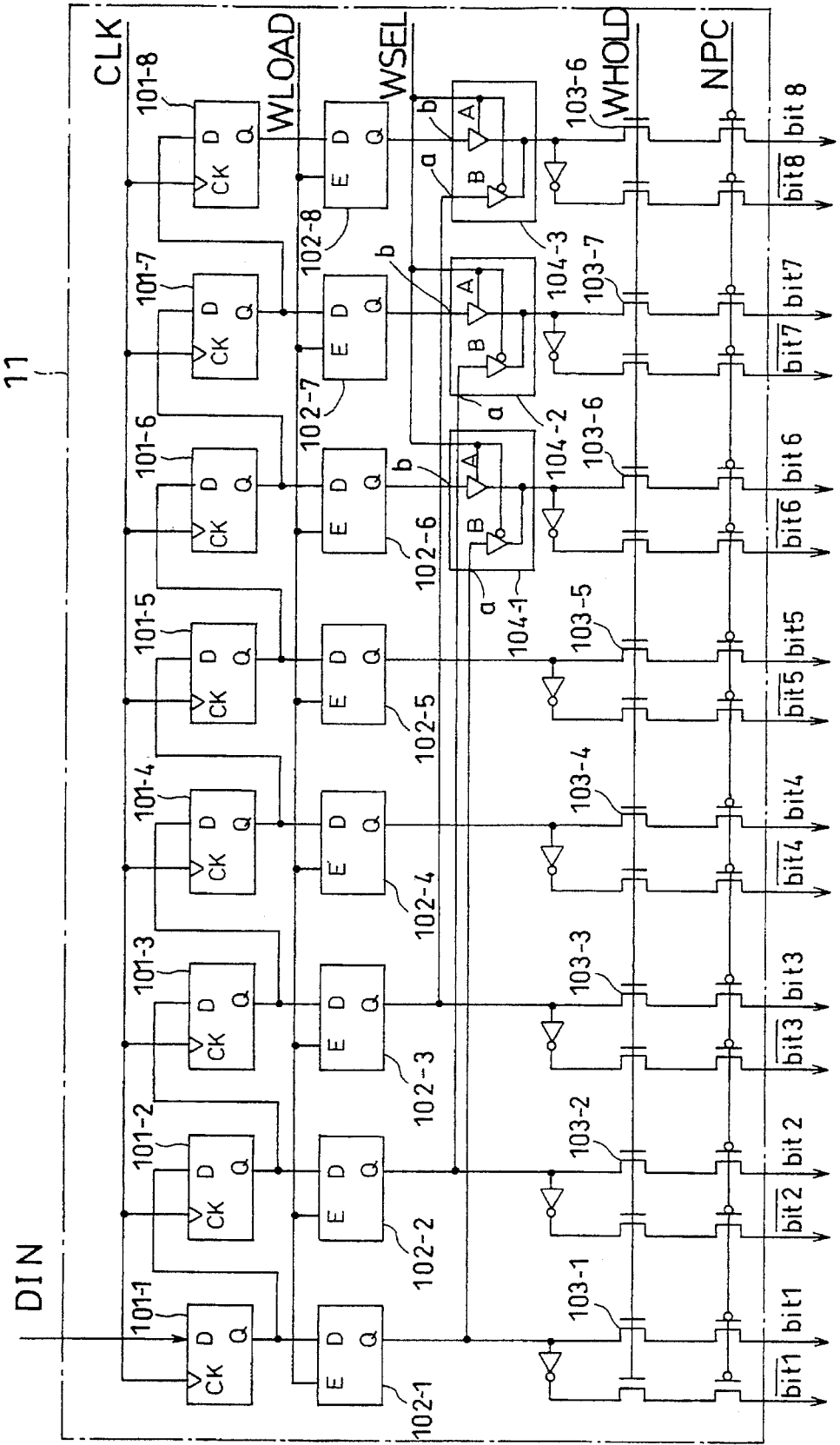
FIG. 2 is a diagram showing a construction of a serial/parallel converter according to the embodiment.

FIG. 2 shows the construction of the serial/parallel converter 11. In the figure, DIN denotes an external input terminal, bit1–bit8 denote parallel output terminals of N in number (8 in the figure), /bit1–/bit8 denote eight other parallel output terminals of N (8) in number which are respectively complementary outputs of the outputs of the parallel output terminals bit1–bit8, 101-1–101-8 denote eight flip-flops (memory elements), 102-1–102-8 denote eight latches (other memory elements), 103-1–103-8 denote eight transfer gates (cutoff elements), and 104-1–104-3 denote selectors (selection elements) of L in number (3 in the figure).

The first flip-flop 101-1 is connected at its input side to the external serial input terminal DIN, and the second to eighth flip-flops 101-2–101-8 are respectively connected at their input sides to the output sides of the first to seventh (i.e., next stage) flop-flops 101-1–101-7. The eight latches 102-1–102-8 are respectively connected at their input sides to the output sides of the eight flip-flops 101-1–101-8.

Each of the three selectors 104-1–104-3 has first and second input terminals a, b. The first input terminals a of the three selectors 104-1–104-3 are respectively connected to the output sides of the first to third latches 102-1–102-3. The second input terminals b of the three selectors 104-1–104-3 are respectively connected to the output sides of the sixth to eighth latches 102-6–102-8.

The first to fifth transfer gates 103-1–103-5 are respectively connected to the output sides of the first to fifth latches 102-1–102-5, and the sixth to eighth transfer gates 103-6–103-8 are respectively connected to the output sides of the selectors 104-1–104-8.

The eight transfer gates 103-1–103-8 are respectively connected to the corresponding parallel output terminals bit1–bit8 which are respectively connected to eight bit lines (described later) of the memory array 12.

Figure 3:
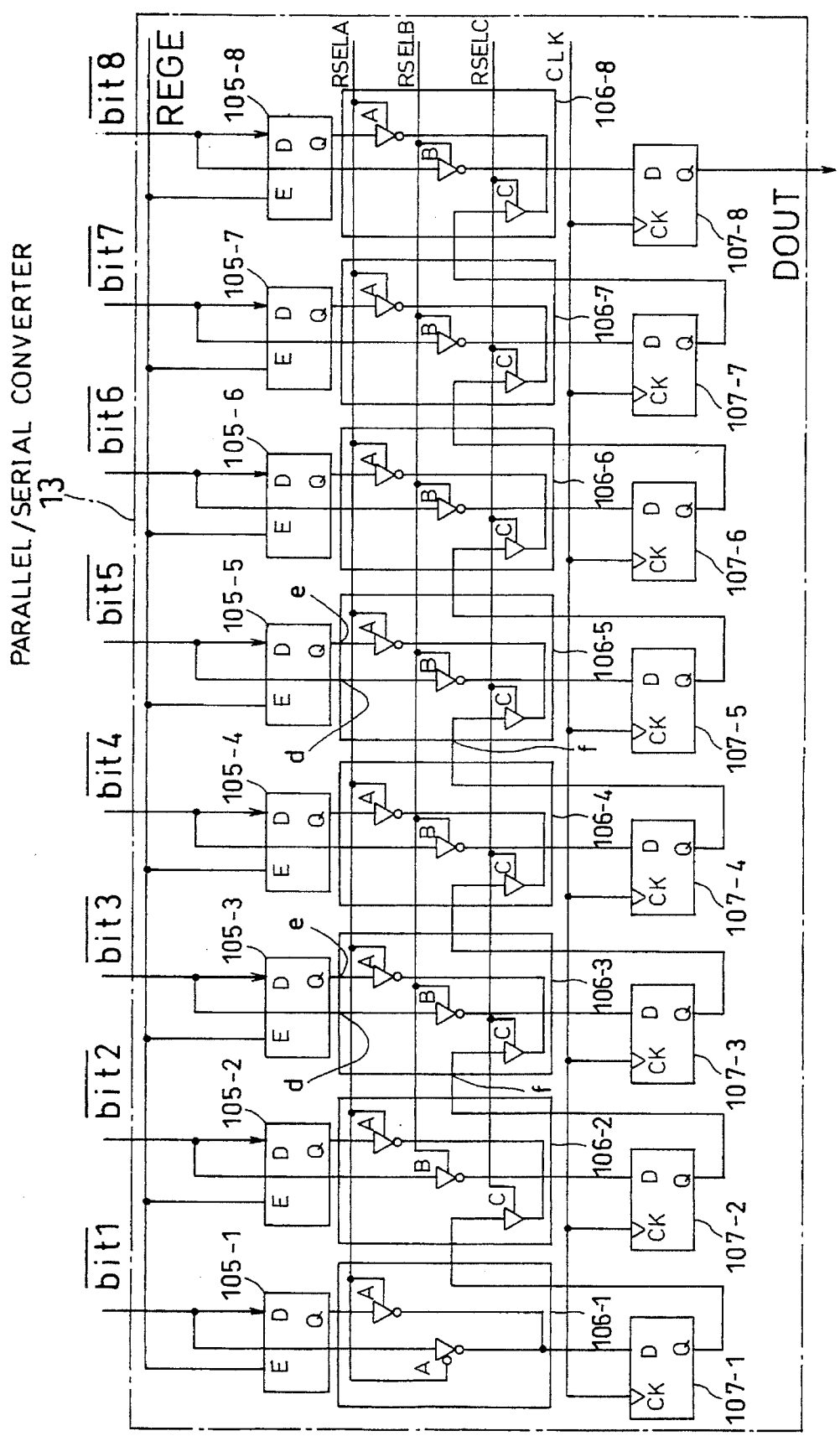
FIG. 3 is a diagram showing a construction of a parallel/serial converter according to the embodiment.

FIG. 3 shows the construction of the parallel/serial converter 13. In the figure, DOUT denotes one external serial output terminal, 105-1–105-8 denote flip-flops (memory elements) of N in number (8 in the figure), 106-1–106-8 denote eight selectors and 107-1 107-8 denote eight other flip-flops (other memory elements).

The first to N-th flip-flops 105-1–105-8 are respectively connected at their input sides to the first to eighth bit lines/bit1–/bit8 of the memory array 12.

The first selector 106-1 has first and second input terminals d, e, and each of the second to eighth selectors 106-2–106-8 has first, second and third input terminals d, e, f. The first input terminals d of the eight selectors 106-1–106-8 are respectively connected to the first to eighth bit lines/bit1–/bit8 of the memory array 12, the second input terminals e thereof are respectively connected to the output sides of the second to eighth flip-flops 105-2–105-8, and the third input terminals f thereof are respectively connected to the output sides of the first to seventh other flip-flops 107-1– 107-7.

The first to eighth other flip-flops 107-1–107-8 are respectively connected at their input sides to the output sides of the first to eighth selectors 106-1–106-8, and the eighth other flip-flop 107-8 is connected at its output side to the external serial output terminal DOUT.

Figure 4:
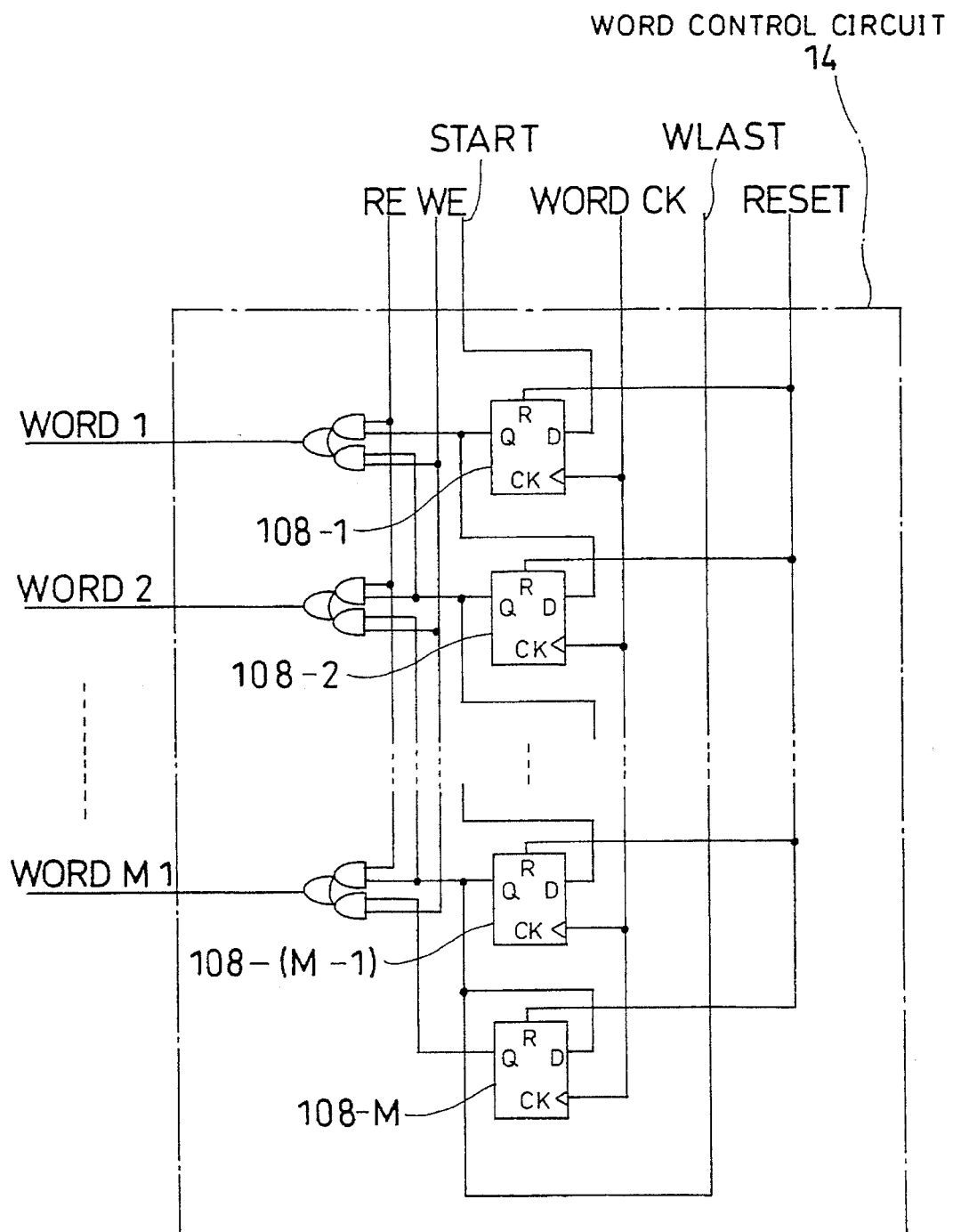
FIG. 4 is a diagram showing a construction of a word control circuit in the embodiment.

FIG. 4 shows the construction of the word control circuit 14. In the figure, 108-1–108-(M–1) denote flip-flops (pointer circuits), and 108-M denotes also a flip-flop. The first flip-flop 108-1 receives a pointer START from the system control circuit 15. The second to (M–1)-th flip-flops 108-2–108-(M–1) respectively receive the pointer from the fore stages of flip-flops 108-1–108-(M–2) and respectively forward the thus received pointer to the next stages of flip-flops 108-3–108. The (M–1)-th flip-flop 108-(M–1) forwards the pointer to the system control circuit 15. The first to (M–1)-th flip-flops 108-1–108-(M–1) are respectively connected at their output sides to the first to (M–1)-th word lines WORD1–WORD(M–1) (described later) of the memory array 12.

Figure 5A:
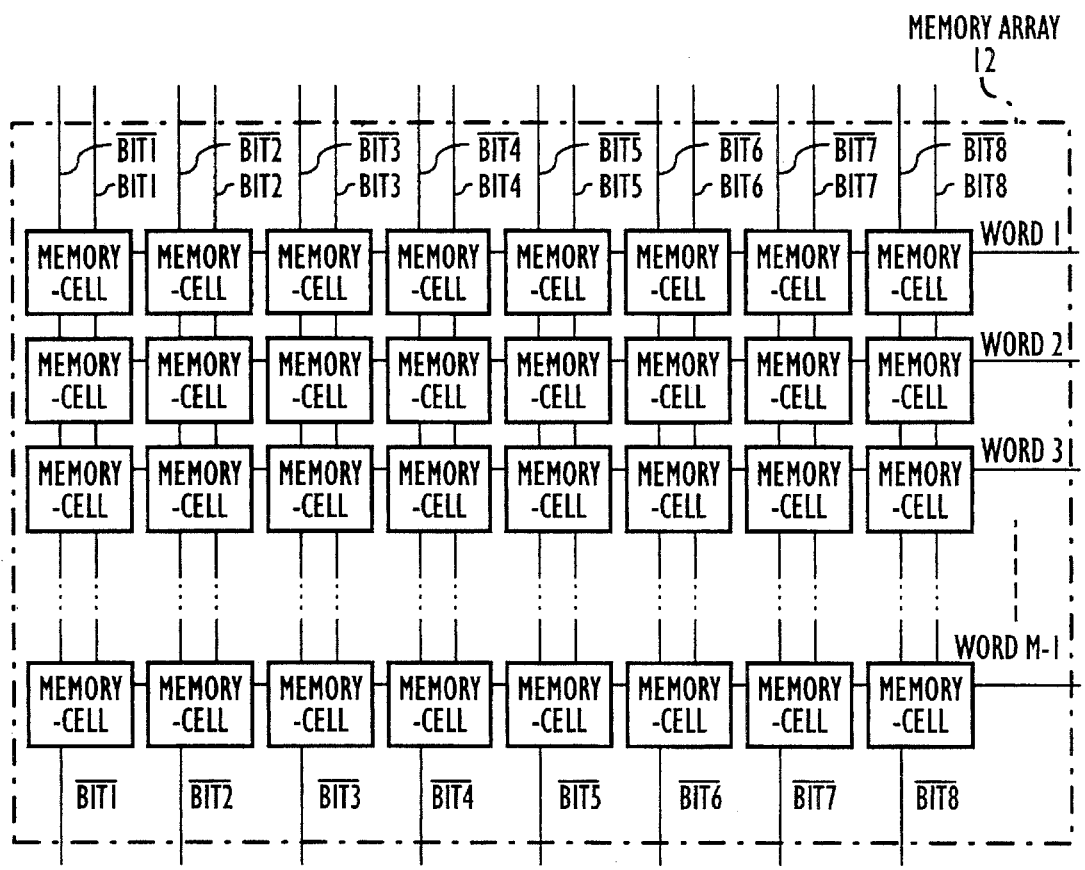
FIG. 5(a) is a diagram showing a construction of a memory array in the embodiment.
Figure 5B:
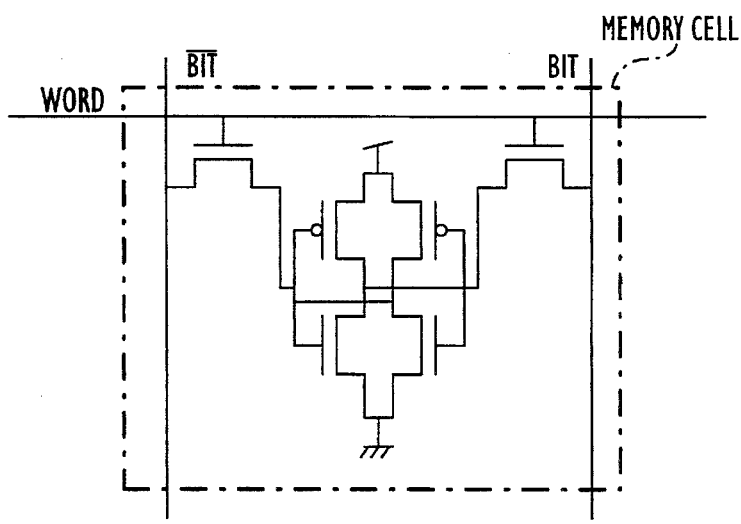
FIG. 5(b) is a diagram showing a construction of a memory cell in the embodiment.

FIG. 5(a) shows the construction of the memory array 12, in which the memory cells are arranged in arrays, and FIG. 5(b) shows the construction of one of the memory cells.

In FIG. 5(a), the memory array 12 is composed of the bit lines bit1–bit8 of N in number (8 in the figure), the word lines WORD1–WORD(M–1) of (M–1) in number and memory cells (memory elements) arranged in N lines in a direction along the word lines and in (M–1) arrays in a direction along the bit lines. The word lines WORD1–WORD(M–1) in each line are connected to one another and the bit lines bit1–bit8 in each array are connected to one another. The eight bit lines bit1– bit8 are connected to the serial/parallel converter 11 and the parallel/serial converter 13, and the first to (M–1)-th word lines WORD1–WORD(M–1) are connected to the word control circuit 14.

In FIGS. 5(a) and 5(b), the memory cells in this embodiment employ static RAMs, so that each word line controls both ports for write and read and each bit line is composed of a pair of bit line of straight polarity and bit line of inverse polarity. Also, the bit lines in FIGS. 2 and 3 which are connected to the memory array are composed of a pair of bit line of straight polarity and bit line of inverse polarity.

Figure 6:
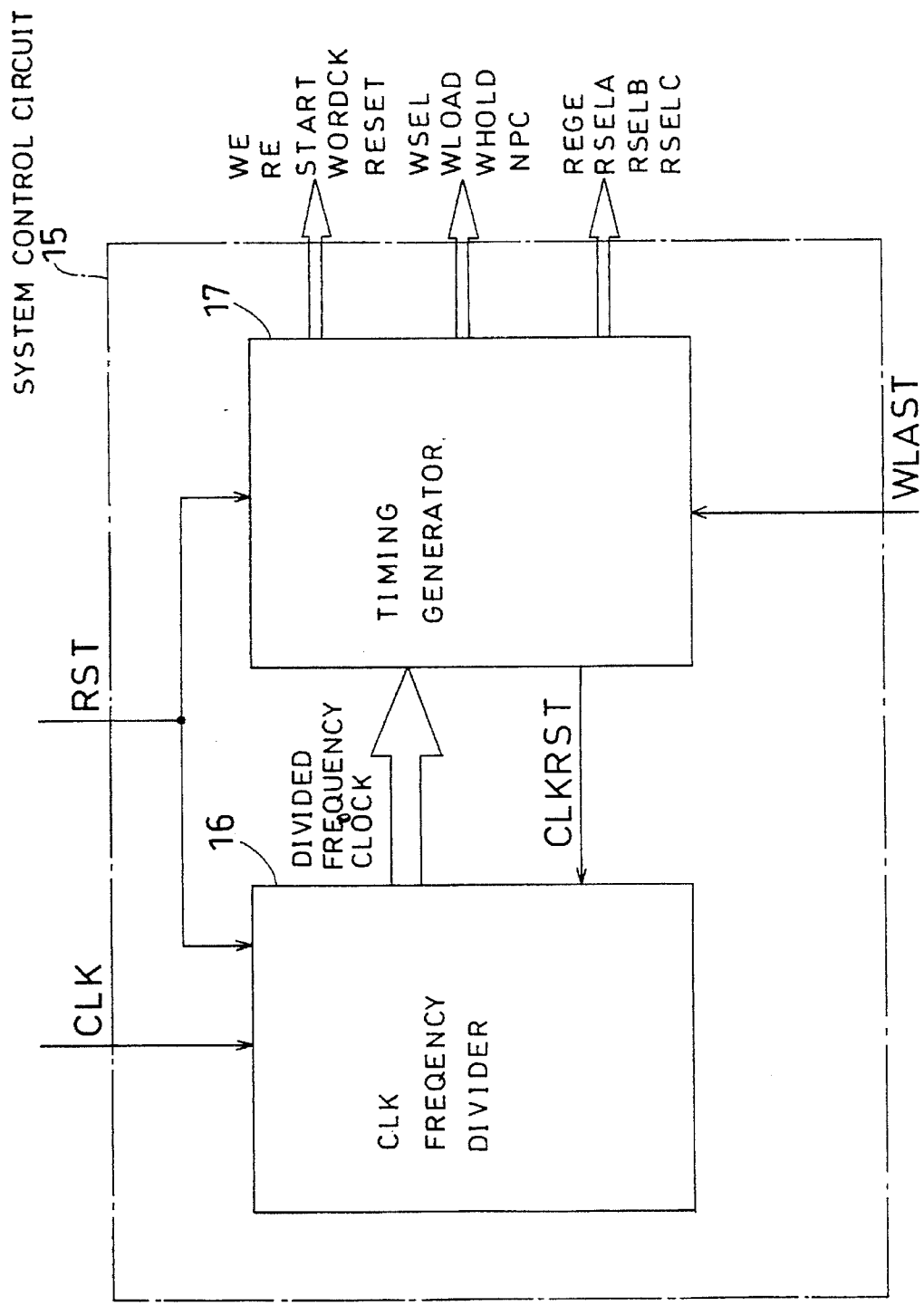
FIG. 6 is a block diagram showing a construction of a system control circuit in the embodiment.

FIG. 6 is a block diagram of the system control circuit 15. In the figure, a clock CLK and a reset signal RST are input from outside. Reference numeral 16 denotes a frequency divider for generating a divided frequency clock into which the clock CLK is divided upon receipt of the clock CLK and the reset signal RST. 17 denotes a timing generator for generating, based on the clock generated by the frequency divider 16, each control signal of the serial/parallel converter 11, the parallel/serial converter 13 and the word control circuit 14.

Figure 7:
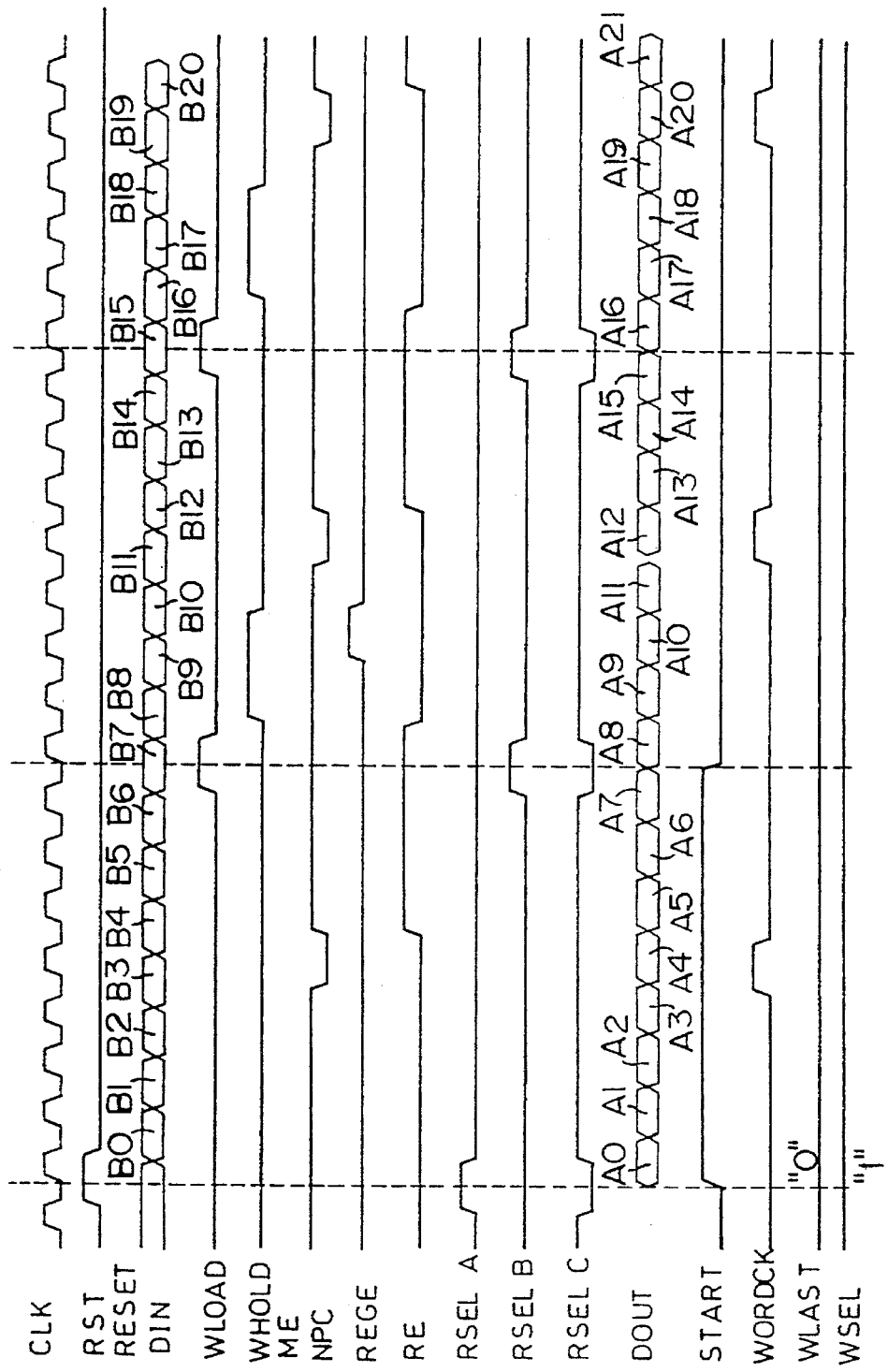
FIG. 7 is a time chart explaining a normal operation in the embodiment.
Figure 8:
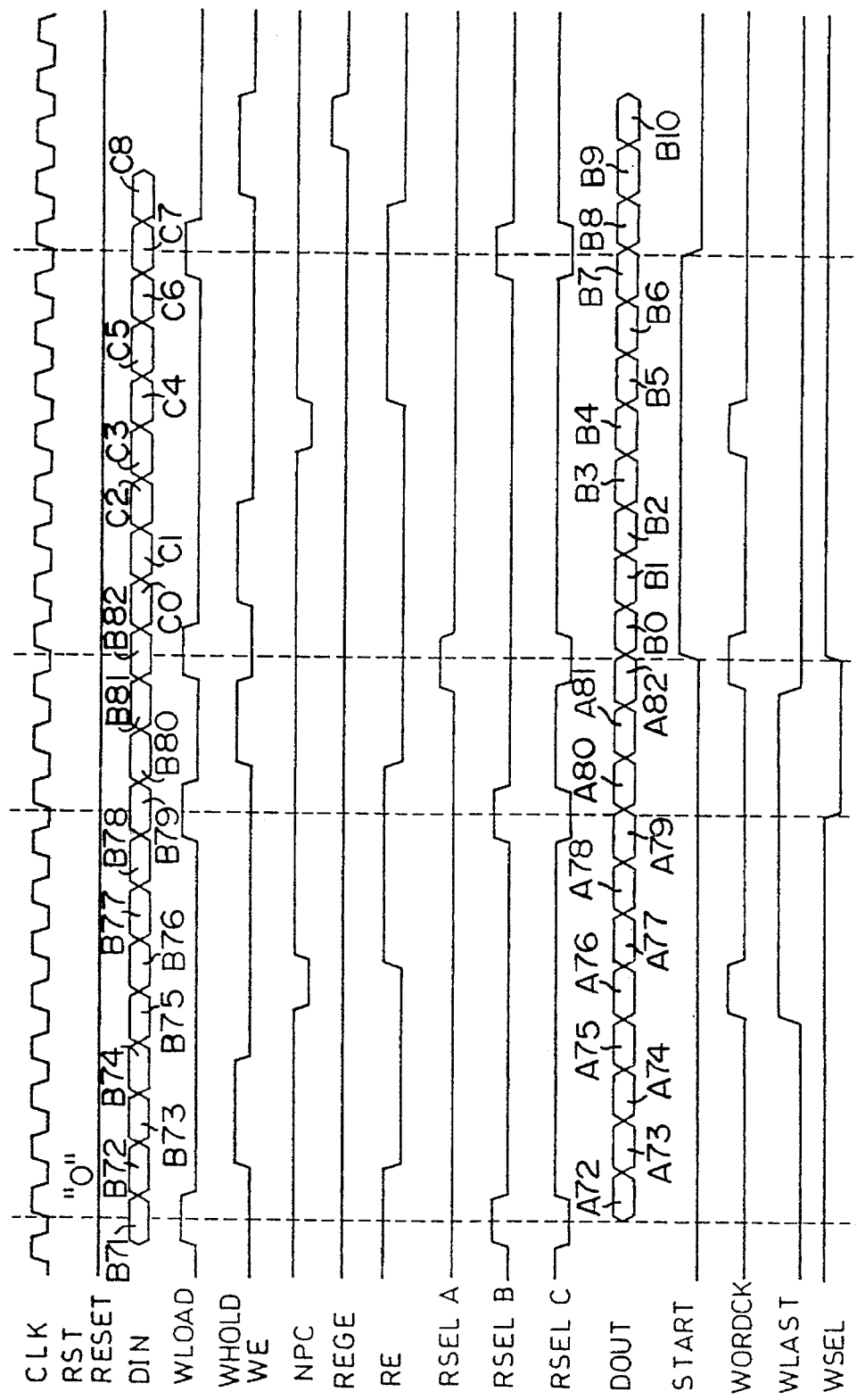
FIG. 8 is a time chart explaining a fetch operation of data of remainder bit number in the embodiment.

Next described is the line memory operation of simple delay type in this embodiment, using the time charts of FIGS. 7 and 8.

In this embodiment, data of bit number B (=N.(M–1)+L=(8.(M–1)+3)) are dealt with as an example of serial data with arbitrary bit width.

In FIG. 2, the serial data input to the flip-flop 101-1 are sequentially fetched into the flip-flops 101-2–101-8 in synchronization with the clock CLK to thus be developed to the parallel data. The development to the parallel data is repeated at every eighth clock.

The developed parallel data are respectively fetched into the latches 102-1–102-8 at the same timing shown in FIG. 7. The control signals WSEL of the selectors 104-1–104-3 are asserted to "1", so that the parallel data fetched in the latches 102-1–102-8 are respectively driven to the bit line 1 to bit line 8 at a write cycle of "WHOLD=1" shown in FIG. 7 by asserting the transfer gates 103-1–103-8. At a prior cycle to a read cycle of "RE=1" shown in FIG. 7, the precharge control signal NPC is asserted to precharge the bit lines.

The above-mentioned control is repeated at every eighth bit to the first to (M–1)-th parallel data.

The M-th parallel data are three-bit data of remainder which are positioned at the end. In this case, as shown in FIG. 7, when the three-bit serial data of remainder are parallelly proceed to the flip-flops 101-1–101-3, the data are respectively fetched into the latches 102-1–102-8 at the same timing.

Wherein, the latches 102-1–102-3 fetch new serial data and the latches 102-4–102-8 fetch a part of the (M–1)-th parallel data. In the write cycle for the M-th parallel data, the transfer gates 103-1–103-8 are asserted while the selector control signals WSEL are asserted to "0". Thereby, the data in the laches 102-1–102-3 are respectively driven to the bit line 1 to the bit line 3 and to the bit line 6 to the bit line 8.

At the same time, the data in the latches 102-4–102-5 are respectively driven to the bit line 4 and the bit line 5.

The first parallel data are respectively stored into the laches 105-1–105-8 in FIG. 3 at the timing of "REGE=1" in FIG. 7.

The second to M-th parallel data are respectively stored into the memory cells in lines connected to the word lines WORD1–WORD(M−1) in FIG. 5(a).

In FIG. 3, as for the first parallel data, the data in the latches 105-1–105-8 are respectively fetched at the same time into the flip-flops 107-1–107-8 by asserting the selector control signals RSELA at the read cycle of "RE=1" shown in FIG. 8. As for the second and following parallel data, the data from bit line 1 to bit line 8 are respectively fetched at the same time into the flip-flops 107-1–107-8 by asserting the selector control signals RSELB. The parallel data fetched in the flip-flops 107-1–107-8 are sequentially output, by asserting the selector control signals RSELC, from the flip-flop 107-8 as the serial output data which synchronize with the clock CLK.

As shown in FIG. 8, when the effective three-bit data out of the M-th final parallel data are serially output, the timing generator 17 in the system control circuit 15 in FIG. 6 judges the time, then the read cycle starts for inputting the next first parallel data stored in the eight flip-flops 101-1–101-8 into the eight latches 102-1–102-8 and the next serial input data start to be input as parallel data into the eight flip-flops 101-1–101-8.

In FIG. 4, the pointer output from the flip-flops 108-1–108-M of the word control circuit 15 specifies the memory array at the line to which the parallel data memory-access. In the initial stage of the operation, each flip-flops 108-1–108-M is initialized by external reset signals RESET, then the first flip-flop 108-1 receives the address pointer START from the system control circuit 15. When a read enable signal RE and a write enable signal WE are asserted respectively in the read cycle and the write cycle, the word line WORD1 of the memory array 12 is asserted. Thereafter, synchronizing with the word line clock signals WORDCK, the address pointer for specifying the selection of word lines of the memory array 12 moves sequentially by every one serial/parallel operation. When the address pointer moves to the last flip-flop 108-M, the last address pointer WLAST is forwarded to the timing generator 17 in the system control circuit 14. The timing generator 17 determines, based on the thus received last address pointer WLAST, each timing of write cycle of the last parallel data, of read cycle of next first parallel data and of write cycle of next serial data.

As described above, in this embodiment, for the serial input data of (8×(M−1)+3) bits, the first one parallel data (8-bit data) are stored in the flip-flops 105-1–105-8 in the parallel/serial converter 13, data from ninth bit to (8×(M−1))-th bit are stored in the memory array 12, the data from (8×(M−1)+1)-th bit to (8×(M−1)+3)-th bit are fetched into the latches 102-1–102-8 in the serial/parallel converter 11, then stored into the memory array 12, interchanging a target access via the selectors 104-1–104-3. Then, heading eight bits out of the stored parallel data of arbitrary bit number are read out from the flip-flops 105-1–105-8 in the parallel/serial converter 13 and the following parallel data are sequentially read out from the memory array 12 to repeat the parallel/serial conversion. Thereby, data with arbitrary bit width of (N×(M−1)+L) can be stored and read out using the line memory of simple delay type without restriction of delay amount of (serial/parallel number×array number of memory array), while performing the memory access of arbitrary serial input data parallelly.

In the above description, the bit number L of remainder is 3. However, the bit number L of remainder may be any number less than the serial/parallel number N (number of data composing one parallel data). Wherein, the selectors 104 of number equal to the bit number L of remainder are required in the serial/parallel converter 11 in FIG. 2.

Figure 9:
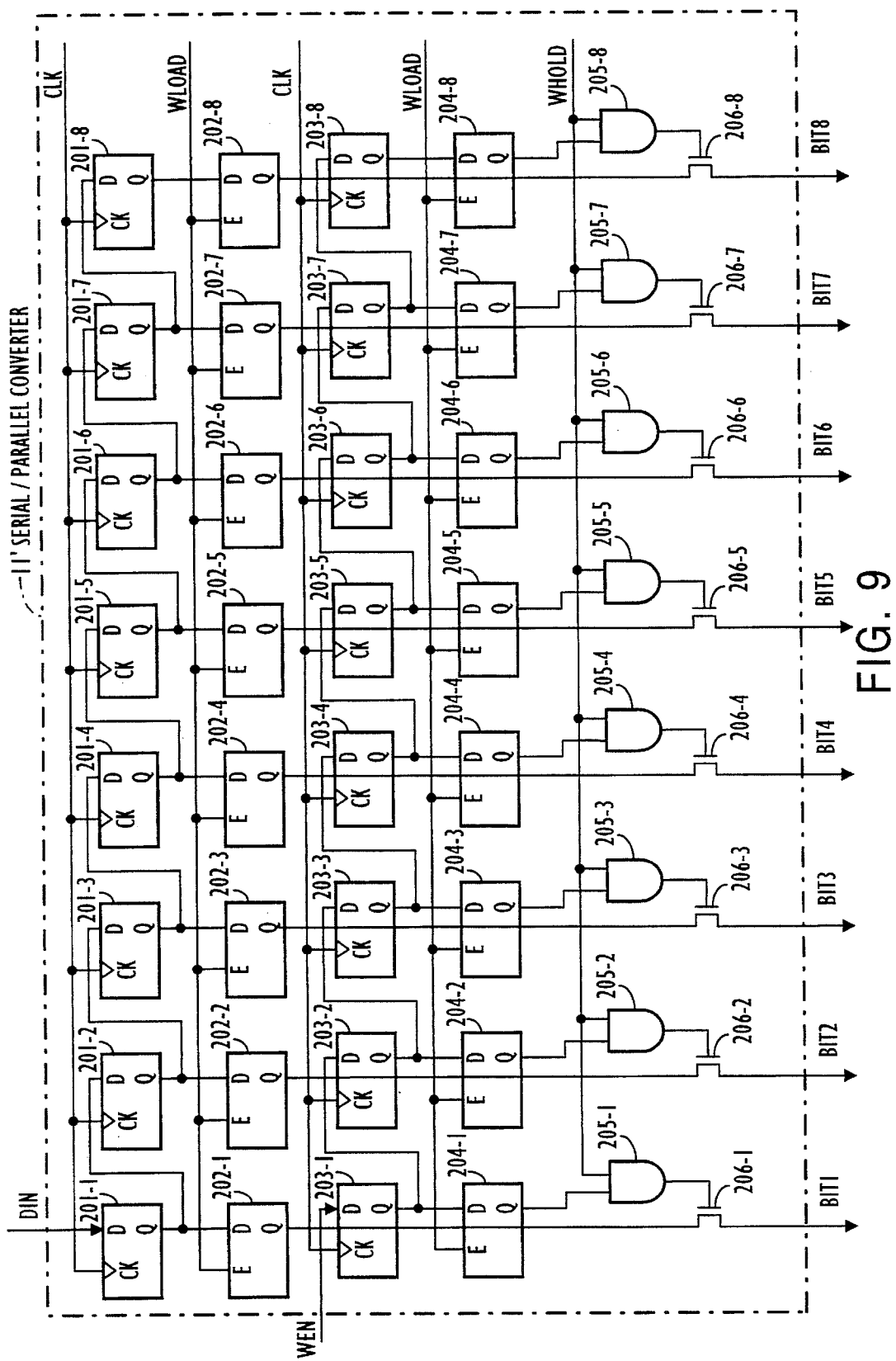
FIG. 9 is a diagram showing a construction of a serial/parallel converter in another embodiment.
Figure 10:
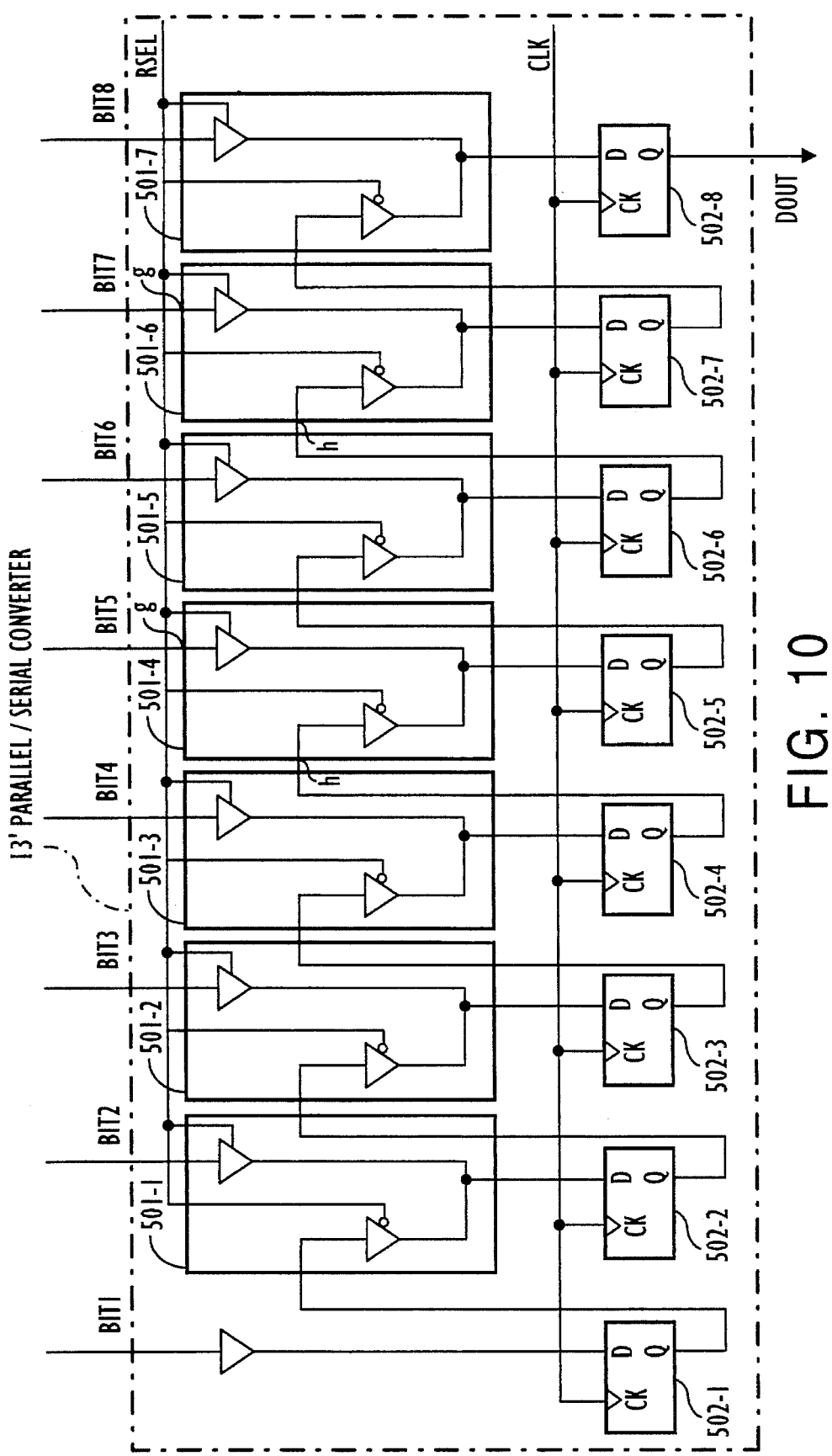
FIG. 10 is a diagram showing a construction of a parallel/serial converter in the embodiment.

FIGS. 9 and 10 show a line memory which performs write-enable-control only to an arbitrary data in another embodiment.

Wherein, the whole construction of the line memory, the constructions of word control circuit and the memory array are the same as in the first embodiment, omitting the description and drawings thereof.

FIG. 9 shows a construction of a serial/parallel converter 11'. In the figure, DIN denotes an external serial input terminal, bit1–bit8 denote eight parallel output terminals, 201-1–201-8 denote first flip-flops (first memory elements) of N in number (8 in the figure), 202-1–202-8 denote eight first latches (second memory elements), 203-1–203-8 denote eight second flip-flops (third memory elements), 204-1–204-8 denote eight second latches (fourth memory elements), 205-1–205-8 denote eight two-input AND elements, and 206-1–206-8 denote eight transfer gates (cutoff elements).

The first first flip-flop 201-1 of the first flip-flops 201-1–201-8 is connected at its input side to the external serial input terminal DIN. The second to eighth first flip-flops 201-2–201-8 are respectively connected at their input side to the output sides of the fore stages of the respective first flip-flops, i.e., the first to seventh first flip-flops 201-1–201-7.

The eight first latches 202-1–202-8 are respectively connected at their input sides to the output sides of the first flip-flops 201-1–201-8.

The first second flip-flop 203-1 of the second flip-flops 203-1–203-8 receives the serial data write enable signal WEN, and the second to eighth second flip-flops 203-2–203-8 are respectively connected at their input sides to the output sides of the fore stages, i.e., the first to seventh second flip-flops 203-1–203-7.

The eight second latches 204-1–204-8 are respectively connected at their input sides to the output sides of the second flip-flops 203-1–203-8. The two-input AND elements 205-1–205-8 are respectively connected at respective ones of input sides to the output sides of the second latches 204-1– 204-8, and respectively receive the parallel data write enable signals WHOLD by respective other input sides.

The eight two-input AND elements 205-1–205-8 are respectively connected at their output sides to control lines of the eight transfer gates 206-1–206-8. The transfer gates 206-1– 206-8 are respectively connected at their input sides to the output sides of the first latches 202-1–202-8.

The transfer gates 206-1–206-8 are respectively connected at their output sides to the parallel output terminals bit1–bit8 which are respectively connected to the eight bit lines of the memory array 12.

FIG. 10 shows a construction of a parallel/serial converter 13' that the parallel/serial converter 13 in FIG. 3 is simplified.

In the parallel/serial converter 13' in FIG. 10, DOUT denotes one external serial output terminal, 502-1–502-8 denote flip-flops (memory elements) of N in number (8 in the figure), 501-1–501-7 are selectors (selection elements) of (N−1) in number (7 in the figure), each of which has first and second input terminals g, h.

The first input terminals g of the seven selectors 501-1–501-7 are respectively connected to the second to eighth bit lines bit2–bit8 of the memory array 12, and the second input terminals h are respectively connected to the output sides of the fore stages, i.e., the first to seventh flip-flops 502-1–502-7.

The first flip-flop 502-1 is connected at its input side to the first bit line bit1 of the memory array 12. The second to eighth flip-flops 502-2–502-8 are respectively connected at their input sides to the output sides of the first to seventh selectors 501-1–501-7, and the output side of the eighth flip-flop 502-8 is connected to the external serial output terminal DOUT. The operation of the thus constructed line memory is discussed next, with reference to the drawings. In this embodiment data of (8×M) bits are dealt with as an example of serial data.

In FIG. 9, the serial data input from the external serial output terminal DIN to the flip-flop 201-1 are sequentially fetched into the flip-flops 201-2–202-8 in construction of shift register, in synchronization with the clock CLK. After proceeding to the last stage of the shift register, the 8-bit data are developed to the latches 202-1–202-8 as parallel data.

After being input into the flip-flop 203-1, the serial data write enable signals WEN are fetched into the flip-flops 203-2– 203-8 in construction of shift register, in synchronization with the clock CLK. After the information of 8 bits proceed to the last stage of shift register, the thus fetched serial data write enable signals WEN proceed to the latches 204-1–204-8.

Figure 11:
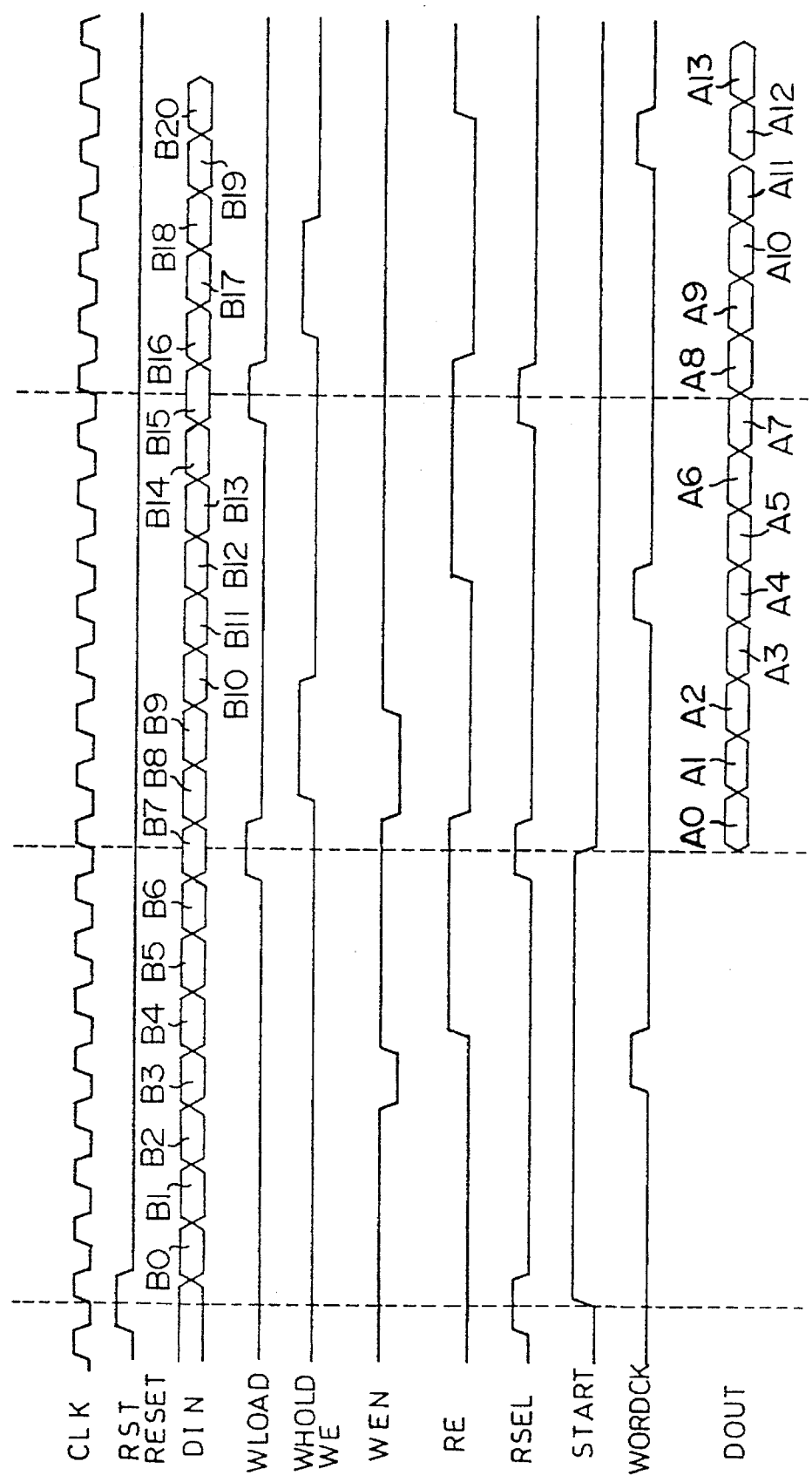
FIG. 11 is a time chart explaining a second-time operation in the embodiment.
Figure 12:
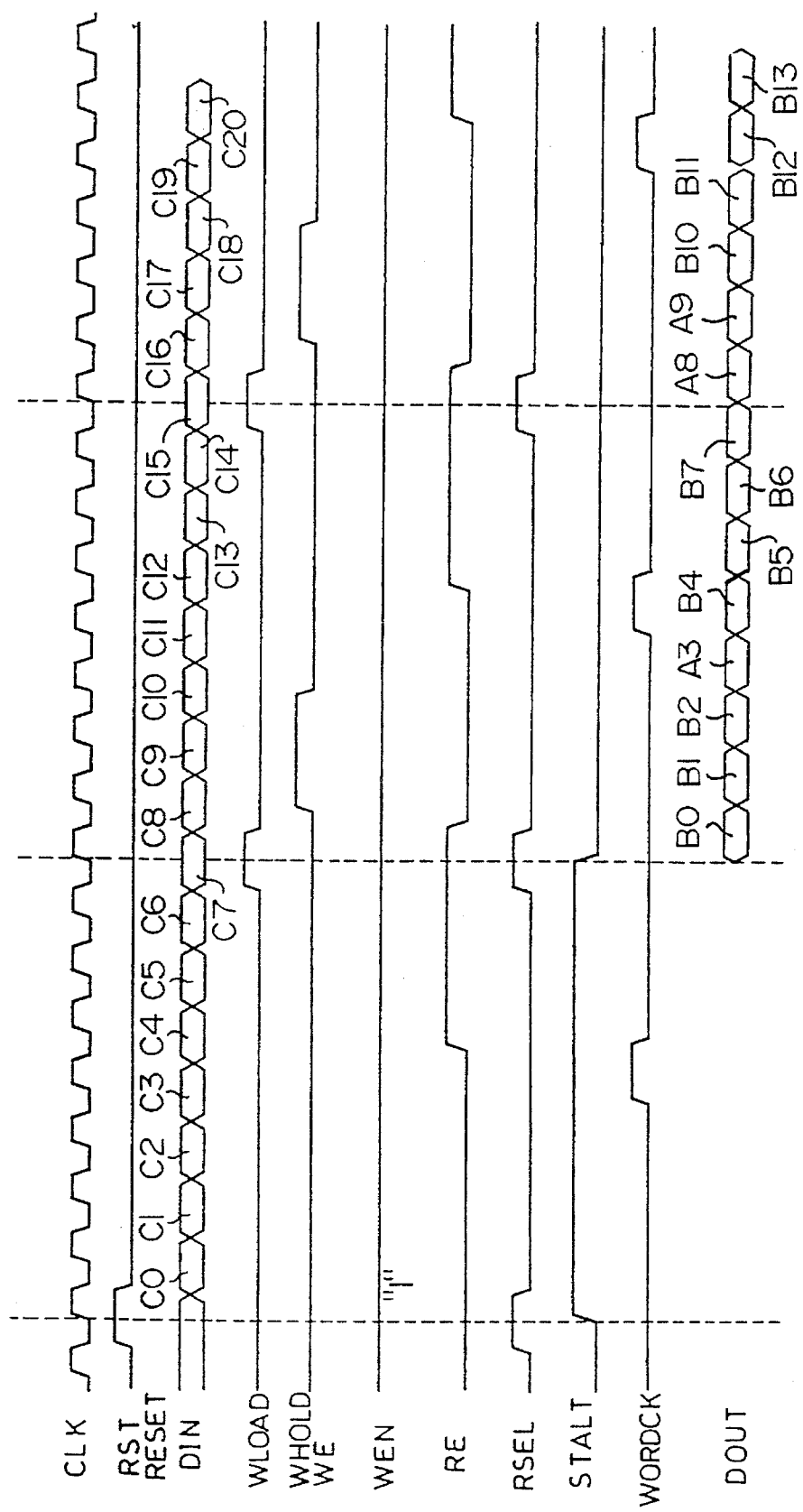
FIG. 12 is a time chart explaining a third-time operation in the embodiment.

As mentioned above, when the parallel data write enable signals WHOLD are asserted after the serial input data and the serial data write enable signals WEN are developed in parallel, only the serial input data corresponding to the serial data write enable signals WEN of ENABLE are driven to the bit lines. The serial/parallel converter 11' in FIG. 9 repeats the above serial/parallel operation at every eighth clock. The detailed timings of each control signal are shown in FIGS. 11 and 12.

Accordingly, the memory access is performed by a unit of memory cell array lines at every serial/parallel operation. At the write cycle, the word line indicated by the pointer is asserted, only the data on the bit lines corresponding to the serial input data corresponding to the serial data write enable signals of ENABLE are fetched into the memory cell, and the data corresponding to the serial input data corresponding to the data write enable signals of DISABLE are not driven to the bit lines. Thus the data on the memory cells maintain the previous value.

On the other hand, at the read cycle, the word line indicated by the pointer is asserted, so that the data in the corresponding memory cells are driven to the bit lines.

In FIG. 10, at the read cycle, the parallel data driven to the bit lines are respectively fetched into the flip-flops 502-1–502-8 via the respective selectors 501-1–501-7 by controlling the selector selection signals RSEL to "1". After the parallel data are respectively fetched to the flip-flops 502-1–502-8, the parallel data respectively move through the flip-clops 502-1 502-8 in construction of shift register in synchronization with the clock CLK by controlling the selector selection signals RSEL to "0", then output as the serial output data from the heading flip-flop 502-8. The parallel/serial converter 13' in FIG. 10 repeats the above parallel/serial operation at every eighth clock. The detailed timings of each control signal are shown in FIGS. 11 and 12.

This embodiment describes the three-time line operation. FIG. 11 shows second-time line operation and FIG. 12 shows third-time line operation. In the first-time line operation, data A0–A(M×(8−1)) are all written, making the serial data write enable signals WEN ENABLE. In the second-time line operation, the data A0–A(M×(8−1)) written at the first-time line operation are read out and data B0–B(M×(8−1)) are written. Since the serial data write enable signals WEN are DISABLE for the data B3, B8 and B9, the data B0, B1, B2, B4, B5, B6, B7, B10 . . . written at the second-time line operation and the data A3, A8 and A9 written at the line first-time line operation and remaining not-updated are read out in the third-time line operation.

The parallel/serial converter 13' in FIG. 10 which is used in this embodiment may be substituted by that in FIG. 3 in the first embodiment, or may be a combined serial/parallel converter of the serial/parallel converter 11 in the first embodiment and that in this embodiment.

In this embodiment, the memory elements composing the memory array 12 are static RAMs but may be dynamic RAMs.

We claim:

1. A line memory comprising:

a serial/parallel converter for converting serial input data into parallel data;

a memory array for storing the parallel data output from said serial/parallel converter;

a parallel/serial converter for converting the parallel data read out from said memory array into serial output data;

a word control circuit for operating an address of said memory array; and a system control circuit for controlling said serial/parallel converter, said parallel/serial converter and said word control circuit, wherein said serial/parallel converter comprises one external serial input terminal, and parallel output terminals of N in number (N is an arbitrary natural number), said serial/parallel converter is composed of memory elements of N in number and selection elements of L in number (L is a natural number smaller than N), each of said selection elements having a first input terminal and a second input terminal, wherein said external serial input terminal is connected to an input side of a first memory element and output sides of a said first memory element to a (N−1)-th memory element are respectively connected to the input sides of a second to an N-th memory element.

2. The line memory of claim 1, further comprising other memory elements of N in number, wherein output sides of the N memory elements are respectively connected to input sides of the N other memory elements, output sides of a first other memory element to an L-th other memory element are respectively connected to a first to an L-th parallel output terminal of the serial/parallel converter and to said first input terminals of a first to an L-th selection terminal, output sides of an (L+1)th other memory element to an (N-L)th other memory element are respectively connected to an (L+1)-th to (N-L)-th parallel output terminal, and output sides of an (N-L+1)-th other memory element to an N-th other memory element are respectively connected to said second input terminals of said first to L-th selection elements.

3. The line memory of claim 2, further comprising cutoff elements of N in number, wherein said first to (N−L)-th cutoff elements are arranged between said first to (N−L)-th other memory elements and said first to (N−L)-th parallel output terminals, and said (N−L+1)-th to N-th cutoff elements are arranged between said first to L-th selection elements and said (N−L+1)-th to N-th parallel output terminals.

4. The line memory of any one of claims 1 to 3, wherein said memory array is composed of bit lines of N in number, word lines of (M−1) in number (M is an arbitrary natural number) and memory elements arranged in N lines in a direction along said word lines and in (M−1) arrays in a direction along said bit lines, said word lines in each line are connected to one another and said bit lines in each array are connected to one another, said first to N-th bit lines are connected to said serial/parallel converter and said parallel/serial converter, and said first to (M−1)-th word lines are connected to said word control circuit.

5. The line memory of any one of claims 1 to 3, wherein said parallel/serial converter is composed of one external serial output terminal, memory elements of N in number, selection elements of N in number each of which has first, second and third input terminals, and other memory elements of N in number, said first to N-th memory elements are respectively connected at the input sides thereof to said first to N-th bit lines of said memory array, said first input terminals of said first to N-th selection elements are respectively connected to said first to N-th bit lines of said memory array, said second input terminals thereof are respectively connected to the output sides of said first to N-th memory elements, said third input terminals thereof are respectively connected to the output sides of said first to (N−1)-th other memory elements, said first to N-th other memory elements are respectively connected at the input sides thereof to the output sides of the first to N-th selection elements, said N-th other memory element is connected at the output side thereof to said external serial output terminal.

6. The line memory of any one of claims 1 to 3, wherein said parallel/serial converter is composed of one external serial output terminal, selection elements of (N−1) in number each of which has first and second input terminals, and memory elements of N in number, said first input terminals of said first to (N−1)-th selection elements are respectively connected to said second to N-th bit lines of said memory array, said second input terminals thereof are respectively connected to the output sides of said first to (N−1)-th memory elements, said first memory element is connected at the input side thereof to said first bit line of said memory array, said second to N-th memory elements are respectively connected at the input sides thereof to the output sides of said first to (N−1)-th selection elements, and said N-th memory element is connected at the output side thereof to said external serial output terminal.

7. The line memory of claim 4, wherein said word control circuit is composed of pointer circuits of (M−1) in number, said first pointer circuit receives a pointer from said system control circuit, K-th pointer circuit (K is a natural number smaller than M) receives the pointer from said (K−1)-th pointer circuit and forwards the thus received pointer to said (K+1)-th pointer circuit, said (M−1)-th pointer circuit forwards the pointer to said system control circuit, and said first to (M−1)-th pointer circuits are respectively connected at the output sides thereof to said first to (M−1)-th word lines.

8. The line memory of claim 1, wherein said serial/parallel converter receives serial data and serial data write enable signals respectively corresponding to data composing said serial data, and said serial/parallel converter has a function of outputting, as parallel data, only data to which said corresponding serial data write enable signals allow writing.

9. A line memory comprising:

a serial/parallel converter for converting serial input data into parallel data;

a memory array for storing the parallel data output from said serial/parallel converter;

a parallel/serial converter for converting the parallel data read out from said memory array into serial output data;

a word control circuit for operating an address of said memory array; and a system control circuit for controlling said serial/parallel converter, said parallel/serial converter and said word control circuit, wherein said serial/parallel converter comprises:

a plurality of memory elements for serial/parallel converting and storing serial data;

a plurality of other memory elements for serial parallel converting and storing serial data write enable signals respectively corresponding to data composing the serial data; and a plurality of cutoff elements for receiving data from said plural memory elements and data write enable signals from said other plural memory elements and for outputting, to said memory array as a parallel data, only data to which the received data write enable signals allow writing out of all the received data.

10. The line memory of claim 9, wherein said serial/parallel converter is composed of first memory elements of N in number, second memory elements of N in number, third memory elements of N in number, fourth memory elements of N in number, AND elements of N in number, cutoff elements of N in number, where N is an arbitrary natural number, said first first memory element out of said first memory elements is connected at the input side thereof to said external serial input terminal, said second to N-th first memory elements are respectively connected at the input sides thereof to the output sides of said first to (N−1)-th first memory elements, said N second memory elements are respectively connected at the input sides thereof to the output sides of said N first memory elements, said first third memory element out of said third memory elements receives at the input side thereof serial data write enable signals, said second to N-th third memory elements are respectively connected at the input sides thereof to the output sides of said first to (N−1)-th third memory elements, said N fourth memory elements are respectively connected at the input sides thereof to the output sides of said N third memory elements, said N AND elements are respectively connected at respective one input sides thereof to the output sides of said N fourth memory elements and respectively receive at respective other input sides thereof parallel data write enable signals, said N AND elements are respectively connected at the output sides thereof to control lines of said N cutoff elements, said N cutoff elements are respectively connected at the input sides thereof to the output sides of said N second memory elements, and said N cutoff elements are respectively connected at the output sides thereof to said first to N-th bit lines of said memory array.

11. A line memory comprising:

a serial/parallel converter;

a memory array;

a parallel/serial converter;

a word control circuit;

a system control circuit; and a selection means, wherein said serial/parallel converter receives serial data to convert it into parallel data, said memory array stores the parallel data output from said serial/parallel converter, said parallel/serial converter converts the parallel data read out from said memory array into serial data and outputs said serial data, said word control circuit operates an address of said memory array, said system control circuit controls said serial/parallel converter, said parallel/serial converter and said word control circuit, the serial data input to said serial/parallel converter are composed of:
  data, the number of which is an integer-multiple of a number of data comprising one parallel data; followed by
  data of remainder bits, the number of which is an integer smaller than the number of data comprising one parallel data, and said selection means is provided in one of said serial/parallel converter and said parallel/serial converter, and outputs the data of remainder bits next to the data positioned before the data of remainder bits.

* * * * *